(12) United States Patent
Fu et al.

(10) Patent No.: US 10,201,104 B2
(45) Date of Patent: Feb. 5, 2019

(54) ELECTRONIC APPARATUS HAVING A DOOR STRUCTURE FOR ACCESSING COMMUNICATION SOCKET

(71) Applicants: BOE TECHNOLOGY GROUP CO., LTD., Beijing (CN); BEIJING BOE MULTIMEDIA TECHNOLOGY CO., LTD., Beijing (CN)

(72) Inventors: Mancang Fu, Beijing (CN); Jigang Lv, Beijing (CN); Enmin Niu, Beijing (CN)

(73) Assignees: BOE TECHNOLOGY GROUP CO., LTD., Beijing (CN); BEIJING BOE MULTIMEDIA TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/519,646

(22) PCT Filed: Oct. 24, 2016

(86) PCT No.: PCT/CN2016/103048
§ 371 (c)(1),
(2) Date: Apr. 17, 2017

(87) PCT Pub. No.: WO2017/092515
PCT Pub. Date: Jun. 8, 2017

(65) Prior Publication Data
US 2017/0367203 A1  Dec. 21, 2017

(30) Foreign Application Priority Data

Dec. 3, 2015 (CN) .......................... 2015 1 0882823

(51) Int. Cl.
*G06F 1/16* (2006.01)
*H05K 5/00* (2006.01)
(Continued)

(52) U.S. Cl.
CPC ......... *H05K 5/0286* (2013.01); *H05K 5/0239* (2013.01); *H05K 5/0278* (2013.01); *H05K 7/14* (2013.01); *H05K 5/04* (2013.01)

(58) Field of Classification Search
CPC .. H05K 5/0286; H05K 5/0239; H05K 5/0278; H05K 7/14
(Continued)

(56) References Cited

U.S. PATENT DOCUMENTS 6,002,581 A * 12/1999 Lindsey ................ G06F 1/1616
312/223.2
6,574,096 B1 * 6/2003 Difonzo ................ G06F 1/1616
345/169
(Continued)

FOREIGN PATENT DOCUMENTS

CN       2372715 Y    4/2000
CN     201408378 Y    2/2010
(Continued)

OTHER PUBLICATIONS

International Search Report & Written Opinion dated Jan. 25, 2017, regarding PCT/CN2016/103048.
(Continued)

*Primary Examiner* — Anthony M Haughton
(74) *Attorney, Agent, or Firm* — Intellectual Valley Law, P.C.

(57) ABSTRACT

The present application discloses an electronic apparatus including an apparatus frame having an aperture; a door movably secured to the apparatus frame and configured to be movable between a first position at which the aperture is accessible and a second position at which the aperture is substantially closed; and a communication socket at least partially enclosed by the apparatus frame; the communication socket having a plurality of communication terminals (Continued)

configured to be accessible for electrical connection with an external apparatus through the aperture. The communication socket includes a first member, the door includes a second member, the first member and the second member being magnetically attractive to each other and cooperatively configured to secure the door in the second position.

14 Claims, 6 Drawing Sheets

(51) Int. Cl.
  *H05K 7/00* (2006.01)
  *H05K 5/02* (2006.01)
  *H05K 7/14* (2006.01)
  *H05K 5/04* (2006.01)

(58) Field of Classification Search
  USPC ............... 361/679.21–679.3, 679.55, 679.56
  See application file for complete search history.

(56) References Cited

U.S. PATENT DOCUMENTS

| | | | | |
|---|---|---|---|---|
| 8,446,712 | B2 * | 5/2013 | Lee | H04M 1/0274 361/679.01 |
| 8,671,227 | B2 * | 3/2014 | Fujimoto | G06F 3/0619 710/10 |
| 9,477,270 | B2 * | 10/2016 | Brehmer | G06F 1/1656 |
| 2002/0141145 | A1 * | 10/2002 | Zadesky | G06F 1/1616 361/679.55 |
| 2014/0293524 | A1 * | 10/2014 | Tsao | G06F 1/1675 361/679.4 |

FOREIGN PATENT DOCUMENTS

| | | |
|---|---|---|
| CN | 203368656 U | 12/2013 |
| CN | 203587900 U | 5/2014 |
| CN | 203587911 U | 5/2014 |
| CN | 203933855 U | 11/2014 |
| CN | 204790709 U | 11/2015 |
| CN | 205356845 U | 6/2016 |

OTHER PUBLICATIONS

First Office Action in the Chinese Patent Application No. 201510882823. 6, dated Jul. 24, 2017; English translation attached.

Second Office Action in the Chinese Patent Application No. 201510882823.6, dated Feb. 14, 2018; English translation attached.

* cited by examiner

ELECTRONIC APPARATUS HAVING A DOOR STRUCTURE FOR ACCESSING COMMUNICATION SOCKET

CROSS-REFERENCE TO RELATED APPLICATION

This application is a national stage application under 35 U.S.C. § 371 of International Application No. PCT/CN2016/103048 filed Oct. 24, 2016, which claims priority to Chinese Patent Application No. 201510882823.6, filed Dec. 3, 2015, the contents of which are incorporated by reference in the entirety.

TECHNICAL FIELD

The present invention relates to display technology, more particularly, to a door structure for accessing the communication socket in an electronic apparatus and an electronic apparatus having the same.

BACKGROUND

Electronic apparatuses (e.g., a television, a computer) are designed to be in communication with multiple external apparatuses. For example, a television may be designed to be connected to a DVD player, a game console, and an external audio system. A computer may be designed to be connected to an external memory, an external audio system, and a smart phone. To accommodate this functionality, the electronic apparatuses are designed to include one or more communication socket having a plurality of communication terminals (e.g., USB terminals).

SUMMARY

In one aspect, the present disclosure provides an electronic apparatus comprising an apparatus frame having an aperture; a door movably secured to the apparatus frame and configured to be movable between a first position at which the aperture is accessible and a second position at which the aperture is substantially closed; and a communication socket at least partially enclosed by the apparatus frame; the communication socket comprising a plurality of communication terminals configured to be accessible for electrical connection with an external apparatus through the aperture; wherein the communication socket comprises a first member, the door comprises a second member, the first member and the second member being magnetically attractive to each other and cooperatively configured to secure the door in the second position.

Optionally, the door is pivotably secured to the apparatus frame.

Optionally, the door comprises a main body, and a rotating shaft connected to the main body; the apparatus frame comprises a mounting groove for mounting the rotating shaft in the mounting groove; and the rotating shaft is configured to be rotatable in the mounting groove.

Optionally, the apparatus frame comprises a first side and a second side connected to the first side, the first side being folded towards the second side along an edge of the first side; the communication socket is secured on the second side; the aperture comprises a first portion on the first side and a second portion on the second side; the plurality of communication terminals are configured to be accessible for electrical connection with the external apparatus through the first portion; the main body comprises a first body corresponding to the first portion and a second body corresponding to the second portion; the first body configured to close the first portion and the second body configured to close the second portion when the door is in the second position; the second member is in the first body; and the rotating shall is in the second body.

Optionally, the mounting groove comprises a first slot and a second slot on the second side of the apparatus frame, the first slot and the second slot proximal to two opposite sides of the second portion of the aperture, respectively; and two opposite ends of the rotating shaft are rotatably engaged with the first slot and the second slot, respectively, to pivotably secure the door to the apparatus frame.

Optionally, the electronic apparatus further comprises a damper between the rotating shaft and the mounting groove.

Optionally, the damper is a ring-like rubber damper coupled between the mounting groove and the rotating shaft and arranged coaxially with respect to the rotating shaft.

Optionally, the main body comprises a plurality of independently operable sub-bodies, each of which corresponding to at least one communication terminal.

Optionally, the communication socket further comprises a socket board; a plurality of communication terminals on the socket board; and a bracket for securing the socket board to the apparatus frame; the apparatus frame comprises a first bolt hole proximal to the aperture; the bracket comprises a second bolt hole corresponding to the first bolt hole; and the electronic apparatus further comprises a bolt mounted through the first blot hole and the second bolt hole to secure the bracket to the apparatus frame.

Optionally, the bracket further comprises a first retaining clip; the socket board comprises a retaining opening; and the first retaining clip and the retaining opening are cooperatively configured to secure the socket board to the bracket.

Optionally, the bracket further comprises a second retaining clip configured to be on top of the rotating shaft to restrict the motion of the rotating shaft to be substantially about an axis of rotation.

Optionally, the first member is a communication terminal; and the second member is a magnet.

Optionally, the communication socket is a USB socket.

Optionally, the electronic apparatus is a display apparatus.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
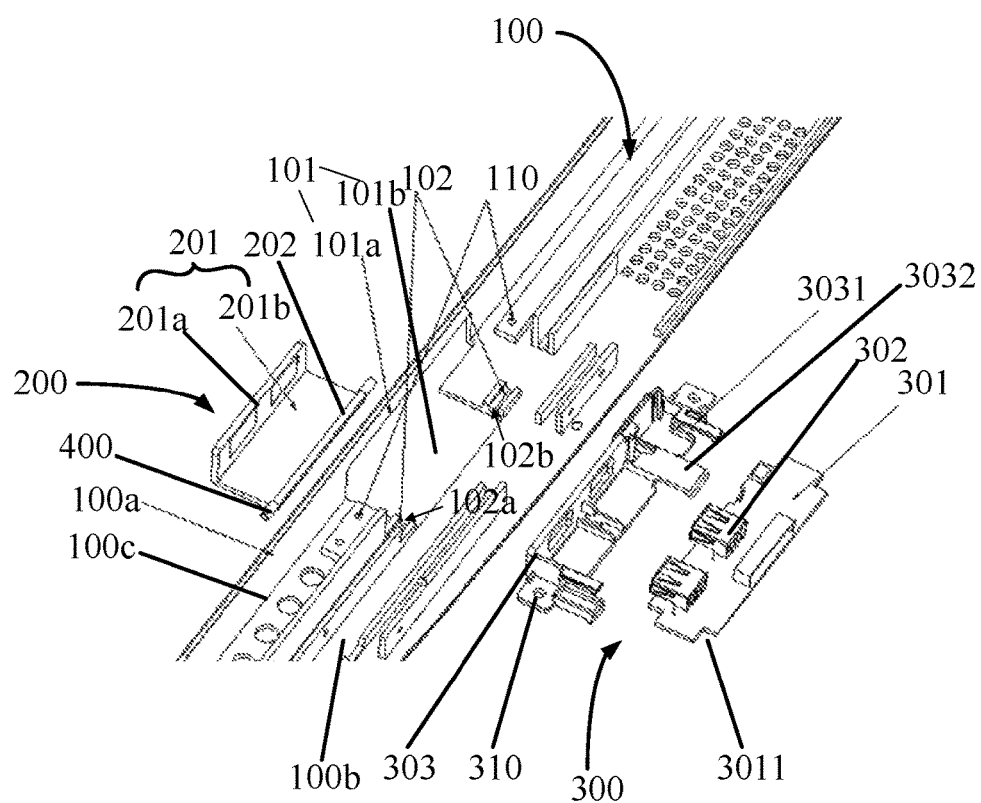
FIG. 1 is an exploded isometric view illustrating the structure of an electronic apparatus having a door structure for a communication socket in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In some conventional electronic apparatuses, the USB sockets are typically disposed at a position which is not easily accessible to a user, e.g., at the back side of the electronic apparatuses. In other conventional electronic apparatuses, the USB sockets are disposed at the front side of the electronic apparatuses. In conventional electronic apparatuses, the USB sockets are either exposed or covered by a buckle structure. The buckle structure is not user friendly and is prone to wear and tear. Moreover, the buckle structure does not have aesthetic appearance.

Accordingly, the present invention provides, inter alia, a door structure for accessing the communication socket in an electronic apparatus and an electronic apparatus having the same that substantially obviate one or more of the problems due to limitations and disadvantages of the related art. In one aspect, the present disclosure provides an electronic apparatus including an apparatus frame having an aperture; a communication socket at least partially enclosed by the apparatus frame; and a door movably secured to the apparatus frame and configured to be movable between a first position at which the communication socket is accessible to the external apparatus through the aperture and a second position at which the aperture is substantially closed. The communication socket includes a plurality of communication terminals configured to be accessible for electrical connection with an external apparatus through the aperture. The communication socket includes a first member, the door includes a second member, the first member and the second member being magnetically attractive to each other, and cooperatively configured to secure the door in the second position.

Optionally, the communication socket is a USB socket. Optionally, the communication socket is electrically connected to the external apparatus through a cable and a plug (e.g., a USB plug) coupled to a communication terminal (e.g., a USB terminal) of the communication socket. Examples of external apparatus include, but are not limited to, a DVD player, a game console, an external audio system, an external memory, and a smart phone.

Optionally, when the door is at the first position, the door is in an open state. Optionally, when the door is at the second position, the door is in a closed state. When the door is at the first position, the aperture is accessible, e.g., for a plug or a cable to extend through the aperture to be coupled with the communication terminal of the communication socket. Optionally, when the aperture is accessible, the communication terminal of the communication socket is accessible for electrical connection with the external apparatus through a plug and a cable. When the door is at the second position, the aperture is substantially closed, e.g., not accessible for a plug or a cable to extend through the aperture to be coupled with the communication terminal of the communication socket.

In some embodiments, the communication socket is disposed inside the electronic apparatus. When the electronic apparatus is assembled, the communication socket is not exposed outside the electronic apparatus except that its communication terminals are accessible through the aperture. For example, the communication socket may be enclosed by the apparatus frame.

Figure 8:
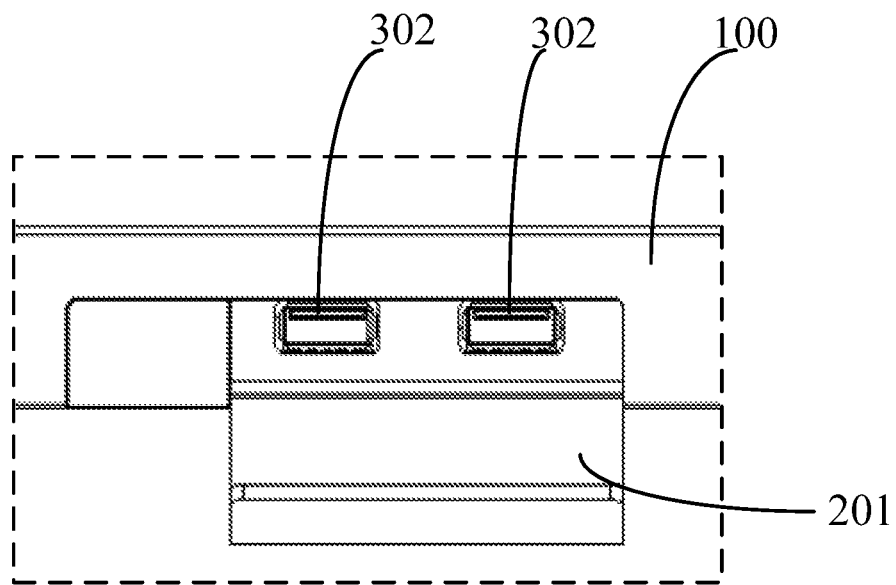
FIG. 8 is a diagram illustrating the structure of a door structure in an open state in some embodiments according to the present disclosure.
Figure 9:
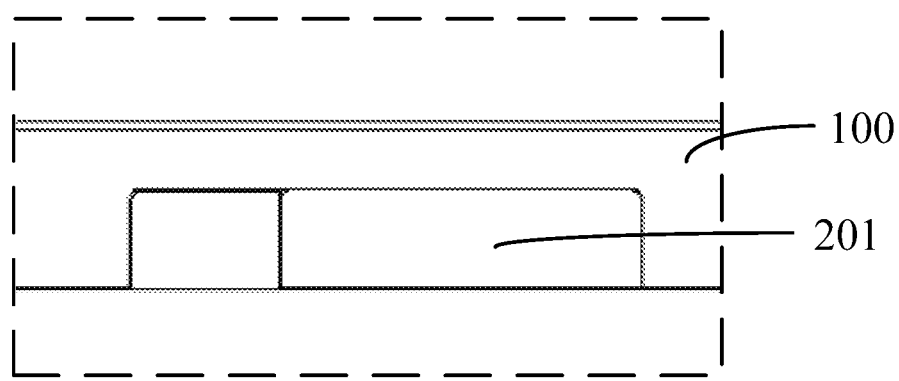
FIG. 9 is a diagram illustrating the structure of a door structure in a closed state in some embodiments according to the present disclosure.

FIG. 1 is an exploded isometric view illustrating the structure of an electronic apparatus having a door structure for a communication socket in some embodiments according to the present disclosure. Referring to FIG. 1, the electronic apparatus in the embodiment includes an apparatus frame 100 having an aperture 101, a communication socket 300 enclosed by the apparatus frame 100 in the electronic apparatus and configured to be electrically connected to an external apparatus through the aperture 101; and a door 200 movably secured to the apparatus frame 100 and configured to be movable between a first position at which the aperture is accessible (see, e.g., FIG. 8) and a second position at which the aperture is substantially closed (see, e.g., FIG. 9). The communication socket 300 includes a plurality of communication terminals 302.

In some embodiments, the electronic apparatus includes a first member and a second member magnetically attractive to each other and cooperatively configured to secure the door in the second position (e.g., a closed position). Optionally, the first member is disposed in the communication socket and the second member is disposed in the door. Optionally, the first member is a communication terminal of the communication socket that is magnetically attractive to a second member (e.g., a magnet piece) in the door. Referring to FIG. 1, the communication socket 300 includes a first member (which is a communication terminal 302 in the embodiment), the door 200 includes a second member 211 (e.g., a magnet piece). The first member 302 and the second member 211 are magnetically attractive to each other. When the door is at the second position, the first member 302 and the second member 211 cooperatively maintain the door at a closed state.

Optionally, the first member may be a component of the communication socket other than a communication terminal. Optionally, the first member is a magnet. Optionally, the second member is a magnet.

By having this design, the door 200 can be used to open and close the aperture 201 in the apparatus frame 100. By having the first member 302 and the second member 211 magnetically attractive to each other disposed in the door 200 and the apparatus frame 100, respectively, the opening and close of the door 200 may be conveniently controlled by the magnetic force between the first member 302 and the second member 211. For example, an external force may be applied to open the door 200, e.g., by pulling. When a user wants to close the door 200, an external force may be applied to close the door 200, e.g., by pushing, and the door 200 may be maintained in the closed state due to the magnetic force between the first member 302 and the second member 211. The design provides a sleek appearance to the electronic apparatus and creates a friendly user experience.

In some embodiments, as shown in FIG. 1, the door 200 is pivotably secured to the apparatus frame 100 at a position proximal to the aperture 101. Optionally, the door 200 is slidably secured to the apparatus frame 100. Various alternative mechanisms may be employed to movably secure the door 200 to the apparatus frame 100 so that the door 200 may be opened or closed as desired. For example, the door 200 may be movably secured to the apparatus frame 100 by the magnetic force alone without any other means. When the user wants to open the door 200, the user simply temporarily takes the door 200 off from the apparatus frame 100. When the user wants to close the door 200, the user simply places the door 200 back to the second position, and the door 200 is maintained in the closed state due to the magnetic force between the first member 302 and the second member 211.

Figure 4:
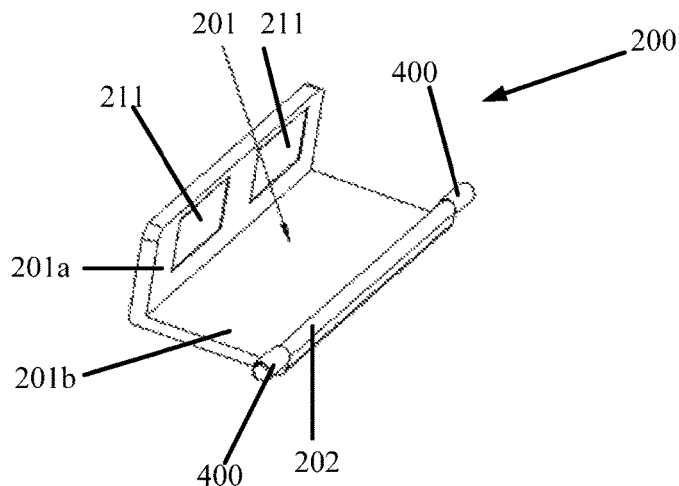
FIG. 4 is a diagram illustrating the structure of an assembled door in an electronic apparatus in some embodiments according to the present disclosure.
Figure 5:
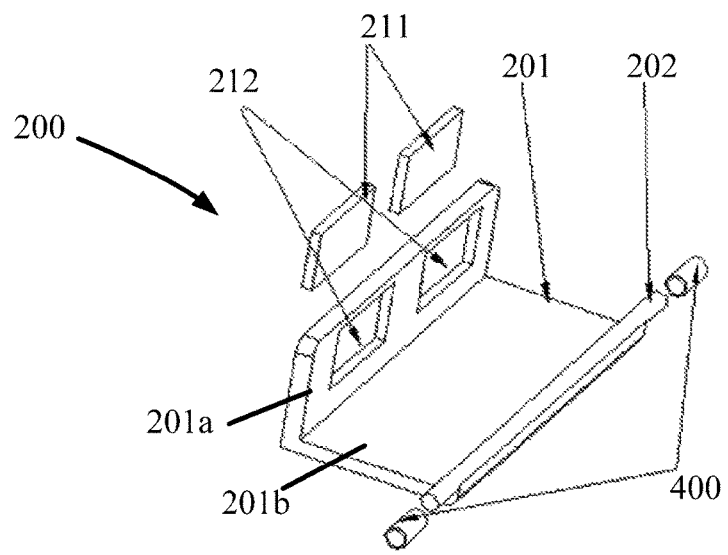
FIG. 5 s an exploded isometric view illustrating the structure of a door structure for a communication socket in an electronic apparatus in some embodiments according to the present disclosure.

FIG. 4 is a diagram illustrating the structure of an assembled door in an electronic apparatus in some embodiments according to the present disclosure. FIG. 5 s an exploded isometric view illustrating the structure of a door structure for a communication socket in an electronic apparatus in some embodiments according to the present disclosure. Referring to FIGS. 1, 4, and 5, the door 200 in some embodiments includes a main body 201, and a rotating shaft 202 connected to the main body 201. The apparatus frame 100 includes a mounting groove 102 for mounting the rotating shaft 202 in the mounting groove 102. The rotating shaft 202 is configured to be rotatable in the mounting groove 102. Optionally, the second member 211 is disposed in the main body 201. By having this design, the door 200 may be conveniently assembled with the apparatus frame 100. Various alternative mechanisms may be employed to rotatably mount the main body 201 to the apparatus frame 100. For example, the main body 201 may be rotatably mounted to the apparatus frame 100 by a hinge.

In conventional electronic apparatuses, the communication sockets such as the USB sockets are typically disposed at the back of the electronic apparatuses. In the present electronic apparatuses, because the communication socket is elegantly concealed by the door, the door for accessing the communication sockets may be disposed anywhere in the electronic apparatus, e.g., at the front side of an electronic apparatus, without affecting aesthetic appearance of the electronic apparatus.

Referring to FIG. 1, the apparatus frame 100 in some embodiments includes a first side 100a and a second side 100b connected to the first side 100a, the first side 100a being folded towards the second side 100b along an edge 100c. Optionally, the first side 100a is folded towards the second side 100b at an angle other than 180 degrees. Optionally, the first side 100a is folded towards the second side 100b at an angle in a range of approximately 45 degrees to approximately 125 degrees. Optionally, the first side 100a is folded towards the second side 100b at an angle in a range of approximately 80 degrees to approximately 100 degrees. Optionally, the first side 100a is substantially perpendicular to the second side 100b. The communication socket 300 is secured on the second side 100b and is accessible on a side proximal to the first side 100a for connecting to the external apparatus. The aperture 101 includes a first portion 101a on the first side 100a and a second portion 101b on the second side 100b. The main body 201 includes a first body 201a corresponding to the first portion 101a and a second body 201b corresponding to the second portion 101b. The first body 201a is configured to close the first portion 101a and the second body 201b is configured to close the second portion 101b when the door is in the second position. Optionally, the first body 201a is folded towards the second body 201b. Optionally, the first body 201a is folded towards the second body 201b at an angle other than 180 degrees. Optionally, the first body 201a is folded towards the second body 201b at an angle in a range of approximately 45 degrees to approximately 125 degrees. Optionally, the first body 201a is folded towards the second body 201b at an angle in a range of approximately 80 degrees to approximately 100 degrees. Optionally, the first body 201a is substantially perpendicular to the second body 201b. Optionally, the first body 201a has a structure matching with that of the first portion 101a. Optionally, the second body 201b has a structure matching with that of the second portion 101b. Optionally, the second member 211 is disposed in the first body 201a. Optionally, the rotating shaft 201 is disposed in the second body 201b.

In some embodiments, the second body 201b is rotatable in the second portion 101b with respect to the rotating shaft 201. The first body 201a moves along with the second body 201b, opening or closing the first portion 101a.

Optionally, the first member may be a metal piece in the communication socket, and the second member may be a magnet in the door. Optionally, the communication terminal of the communication socket is made of a metal. Optionally, the first member is the communication terminal of the communication socket, and the second member may be a magnet in the door. Referring to FIG. 5, the first body 201a in the embodiment includes a mounting groove 212 for mounting the second member 211 (e.g., a magnet). This design provides a simple structure using the communication terminal 302 of the communication socket 300 and the magnetic second member 211 for cooperatively securing the door 200 to in the second position.

Optionally, the first member may be a component of the communication socket other than a communication terminal. Optionally, the first member is a metal component of the communication socket other than a communication terminal. Optionally, the first member is a magnetic component of the communication socket.

Referring to FIG. 1, the mounting groove 102 in some embodiments includes a first slot 102a and a second slot 102b on the second side 100b of the apparatus frame 100. Optionally, the first slot 102a and the second slot 102b are proximal to two opposite sides of the second portion 101b of the aperture 101, respectively. Two opposite ends of the rotating shaft 202 are rotatably engaged with the first slot 102a and the second slot 102b, respectively, to pivotably secure the door 200 to the apparatus frame 100.

Figure 6:
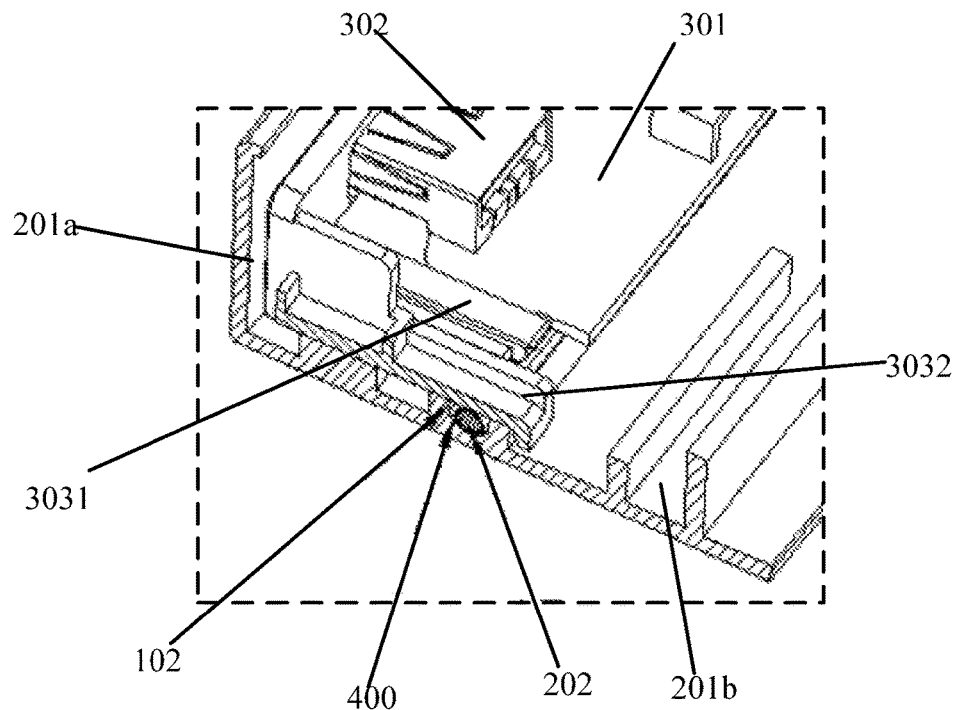
FIG. 6 is a diagram illustrating the structure of a door structure and a communication socket assembled together in an electronic apparatus in some embodiments according to the present disclosure.
Figure 7:
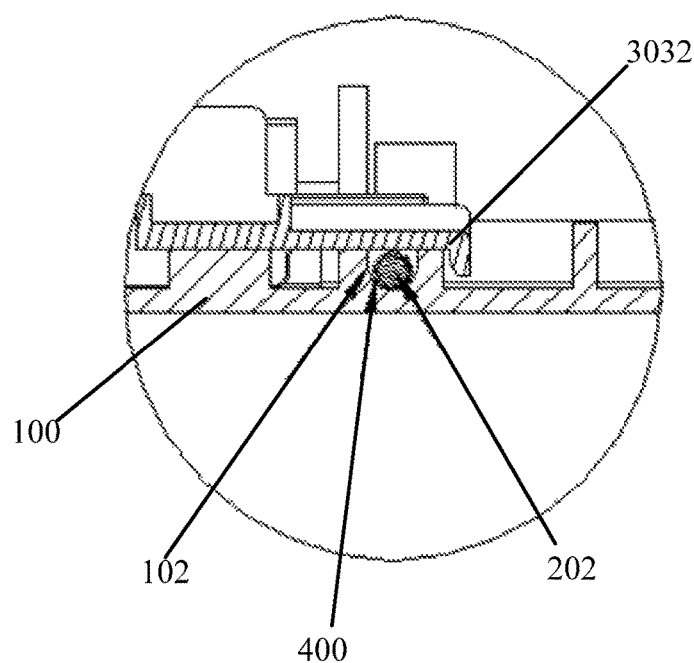
FIG. 7 is a diagram illustrating the structure of a door structure and a communication socket assembled together in an electronic apparatus in some embodiments according to the present disclosure.

In some embodiments, the electronic apparatus further includes a damper between the rotating shaft and the mounting groove. The damper provides a damping effect when the door is being opened or closed. Various dampers may be used for providing the damping effect. FIG. 6 is a diagram illustrating the structure of a door structure and a communication socket assembled together in an electronic apparatus in some embodiments according to the present disclosure. FIG. 7 is a diagram illustrating the structure of a door structure and a communication socket assembled together in an electronic apparatus in some embodiments according to the present disclosure. Referring to FIGS. 6 and 7, the electronic apparatus in the embodiment further includes a ring-like rubber damper 400 coupled between the rotating shaft 202 and the mounting groove 102. The rubber damper 400 is arranged coaxially with respect to the rotating shaft 202.

Figure 10:
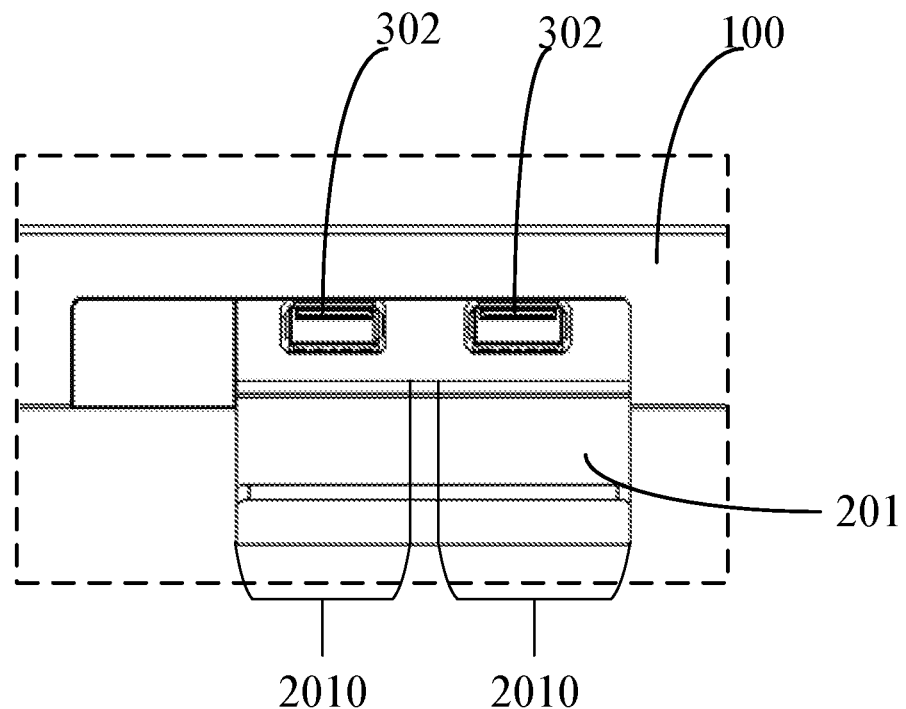
FIG. 10 is a diagram illustrating the structure of a door structure in an open state in some embodiments according to the present disclosure.
Figure 11:
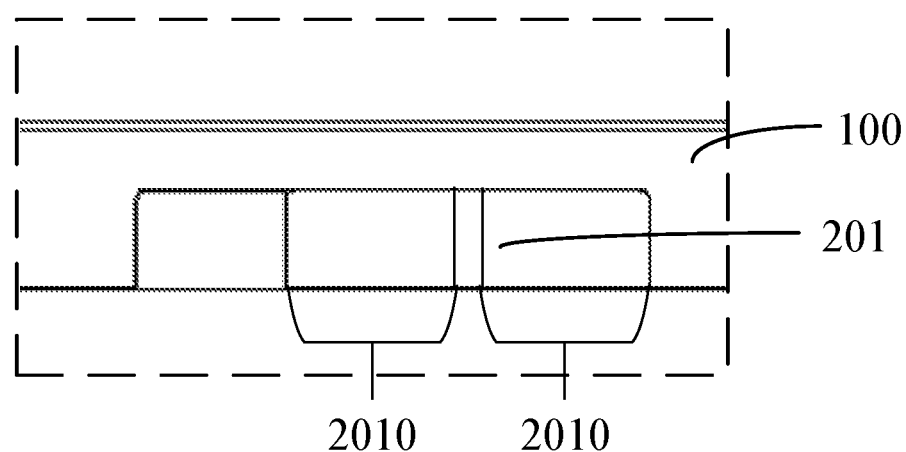
FIG. 11 is a diagram illustrating the structure of a door structure in a closed state in some embodiments according to the present disclosure.

In some embodiments, the main body is an integral body. In some embodiments, the communication socket includes a plurality of communication terminals, and the main body includes a plurality of independently operable sub-bodies, each of which corresponding to at least one communication terminal. FIG. 10 is a diagram illustrating the structure of a door structure in an open state in some embodiments according to the present disclosure. FIG. 11 is a diagram illustrating the structure of a door structure in a closed state in some embodiments according to the present disclosure. Referring to FIG. 10 and FIG. 11, the communication socket includes a plurality of communication terminals 302, and the main body 201 includes a plurality of independently operable sub-bodies 2010, each of which corresponding to at least one communication terminal 302. For example, each sub-body 2010 may independently open or close a portion of the aperture. Optionally, each sub-body 2010 may be pivotably secured to the apparatus frame through a rotating shaft. Optionally, the door includes a plurality of rotating shafts corresponding to the plurality of sub-bodies 2010, each sub-body 2010 is pivotably secured to the apparatus frame through a corresponding rotating shaft. By having this design, the plurality of communication terminals 302 may be independently accessible.

Figure 2:
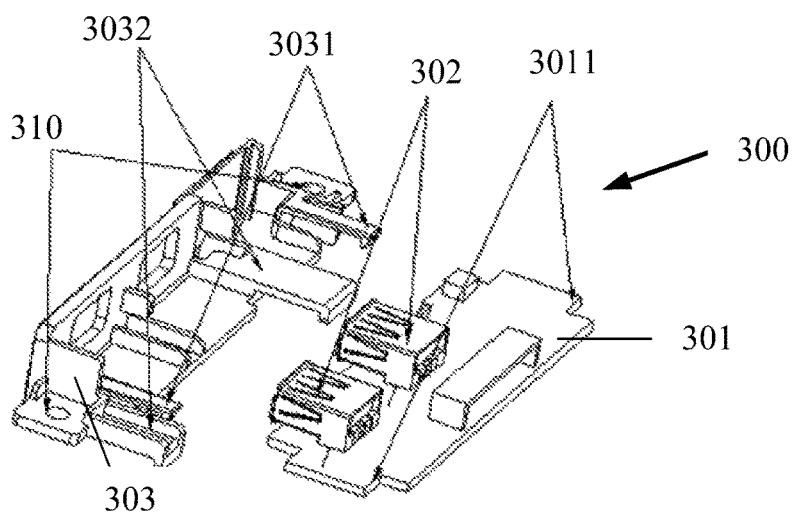
FIG. 2 is an exploded isometric view illustrating the structure of a communication socket in an electronic apparatus in some embodiments according to the present disclosure.
Figure 3:
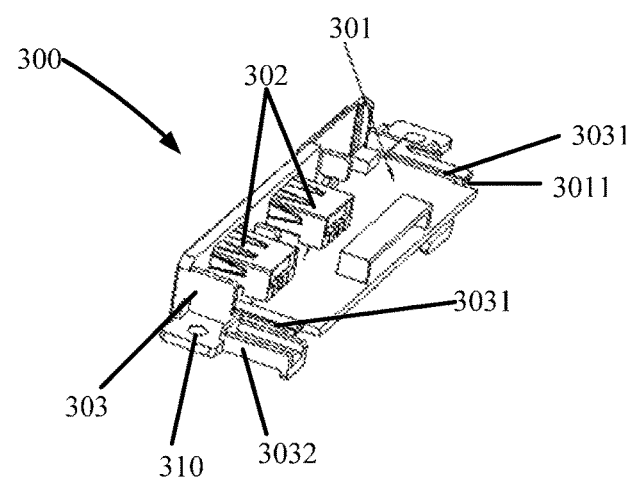
FIG. 3 is a diagram illustrating the structure of an assembled communication socket in an electronic apparatus in some embodiments according to the present disclosure.

FIG. 2 is an exploded isometric view illustrating the structure of a communication socket in an electronic apparatus in some embodiments according to the present disclosure. FIG. 3 is a diagram illustrating the structure of an assembled communication socket in an electronic apparatus in some embodiments according to the present disclosure. Referring to FIGS. 1-3, the communication socket 300 in some embodiments includes a socket board 301; a plurality of communication terminals 302 on the socket board 301; and a bracket 303 for securing the socket board 301 to the apparatus frame 100.

Referring to FIG. 1, the apparatus frame 100 includes a pair of first bolt holes 110 proximal to the aperture 101, e.g., proximal to two opposite sides of the aperture 101. Referring to FIGS. 1-3, the bracket 303 includes a pair of second bolt holes 310 corresponding to the pair of first bolt holes 110. In some embodiments, the electronic apparatus further includes a bolt mounted through a pair of corresponding first blot hole 110 and second bolt hole 310 to secure the bracket to the apparatus frame 100. Optionally, the electronic apparatus two blots, each of which mounted through a pair of corresponding first blot hole 110 and second bolt hole 310.

Referring to FIGS. 1-3, the bracket 303 in some embodiments further includes a first retaining clip 3031, the socket board 301 includes a retaining opening 3011, and the first retaining clip 3031 and the retaining opening 3011 cooperatively configured to secure the socket board 301 to the bracket 303, Moreover, the bracket 303 in some embodiments further includes a second retaining clip 3032 configured to be on top of the rotating shaft 202 to restrict the motion of the rotating shaft 202 to be substantially about an axis of rotation. For example, the second retaining clip 3032 is configured to substantially confine the rotating shaft 202 to be engaged with the first slot 102a and the second slot 102b.

Based on the above, the present door structure may be conveniently assembled into the present electronic apparatus. In some embodiments, the door 200 may be assembled by a process including first securing a magnet in the mounting groove 102 of the main body 201, followed by installing the rubber damper 400 on the rotating shaft 202. The magnet may be secured to the main body 201 using various methods, e.g., using a glue. In some embodiments, the communication socket 300 may be assembled by a process including inserting the socket board 301 into the bracket 303, and securing the socket board 301 in the bracket 303 by engaging the first retaining clip 3031 with the retaining opening 3011. In some embodiments, the door 200, the communication socket 300, and the apparatus frame 100 may be assembled together by a process including placing the door 200 in the aperture 101, engaging portions of the rotating shaft 202 having the rubber damper 400 with the first slot 102a and the second slot 102b, placing the communication socket 300 in the apparatus frame 100, securing a bolt in a pair of first bolt hole 110 and second bolt hole 310, and placing the second retaining clip 3032 on top of the rotating shaft 202 and confining the rotating shaft 202 to be engaged with the first slot 102a and the second slot 102b.

In some embodiments, the electronic apparatus is a display apparatus. Examples of appropriate touch display apparatuses includes, but are not limited to, an electronic paper, a mobile phone, a. tablet computer, a television, a monitor, a notebook computer, a digital album, a GPS, etc. In some embodiments, the electronic apparatus is apparatus in a motor vehicle.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An electronic apparatus, comprising:
    an apparatus frame having an aperture;
    a door movably secured to the apparatus frame and configured to be movable between a first position at which the aperture is accessible and a second position at which the aperture is substantially closed; and
a communication socket at least partially enclosed by the apparatus frame; the communication socket comprising a plurality of communication terminals configured to be accessible for electrical connection with an external apparatus through the aperture;
wherein the communication socket comprises a first member, the door comprises a second member, the first member and the second member being magnetically attractive to each other and cooperatively configured to secure the door in the second position;
the door comprises a main body;
wherein the apparatus frame comprises a first side and a second side connected to the first side, the first side being folded towards the second side along an edge of the first side;
the communication socket is secured on the second side;
the aperture is accessible from the first side and the second side when the door is at the first position; the plurality of communication terminals are configured to be accessible for electrical connection with the external apparatus through the aperture from the first side when the door is at the first position;
the main body comprises a first body and a second body; and
the first body and the second body are configured to close the aperture respectively from the first side and the second side when the door is in the second position.

2. The electronic apparatus of claim 1, wherein the door is pivotably secured to the apparatus frame.

3. The electronic apparatus of claim 2, wherein the door further comprises a rotating shaft connected to the main body;
the apparatus frame comprises a mounting groove for mounting the rotating shaft in the mounting groove; and
the rotating shaft is configured to be rotatable in the mounting groove.

4. The electronic apparatus of claim 3, wherein
the communication socket is secured on the second side;
the second member is in the first body; and
the rotating shaft is in the second body.

5. The electronic apparatus of claim 3, wherein the mounting groove comprises a first slot and a second slot on the second side of the apparatus frame, the first slot and the second slot on the second side of the aperture frame and adjacent to two opposite sides of the aperture, respectively; and two opposite ends of the rotating shaft are rotatably engaged with the first slot and the second slot, respectively, to pivotably secure the door to the apparatus frame.

6. The electronic apparatus of claim 3, further comprising a damper between the rotating shaft and the mounting groove.

7. The electronic apparatus of claim 4, wherein the damper is a ring-like rubber damper coupled between the mounting groove and the rotating shaft and arranged coaxially with respect to the rotating shaft.

8. The electronic apparatus of claim 3, wherein the main body comprises a plurality of independently operable sub-bodies, each of which corresponding to at least one communication terminal.

9. The electronic apparatus of claim 1, wherein the communication socket further comprises a socket board; a plurality of communication terminals on the socket board; and a bracket for securing the socket board to the apparatus frame;
the apparatus frame comprises a first bolt hole proximal to the aperture;
the bracket comprises a second bolt hole corresponding to the first bolt hole; and
the electronic apparatus further comprises a bolt mounted through the first blot hole and the second bolt hole to secure the bracket to the apparatus frame.

10. The electronic apparatus of claim 9, wherein the bracket further comprises a first retaining clip;
the socket board comprises a retaining opening; and
the first retaining clip and the retaining opening are cooperatively configured to secure the socket board to the bracket.

11. The electronic apparatus of claim 9, wherein the door further comprises a rotating shaft connected to the main body;
wherein the bracket further comprises a second retaining clip configured to be on top of the rotating shaft to restrict motion of the rotating shaft to be substantially about an axis of rotation.

12. The electronic apparatus of claim 9, wherein the first member is a communication terminal; and the second member is a magnet.

13. The electronic apparatus of claim 1, wherein the communication socket is a USB socket.

14. The electronic apparatus of claim 1, wherein the electronic apparatus is a display apparatus.

* * * * *